(12) United States Patent
Lewis et al.

(10) Patent No.: US 11,647,591 B2
(45) Date of Patent: May 9, 2023

(54) COMPLIANT PIN SURFACE MOUNT TECHNOLOGY PAD FOR REWORK

(71) Applicant: International Business Machines Corporation, Armonk, NY (US)

(72) Inventors: Theron Lee Lewis, Rochester, MN (US); David J. Braun, St. Charles, MN (US); John R. Dangler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 17/343,857

(22) Filed: Jun. 10, 2021

(65) Prior Publication Data

US 2022/0400557 A1   Dec. 15, 2022

(51) Int. Cl.
| | | |
|---|---|---|
| *H05K 3/22* | (2006.01) | |
| *H05K 3/34* | (2006.01) | |
| *H01R 12/58* | (2011.01) | |
| *B23K 1/00* | (2006.01) | |
| *B23K 1/20* | (2006.01) | |

(Continued)

(52) U.S. Cl.
CPC ........... *H05K 3/225* (2013.01); *B23K 1/0016* (2013.01); *B23K 1/203* (2013.01); *B23K 3/0653* (2013.01); *H01R 12/58* (2013.01); *H05K 3/3447* (2013.01); *B23K 2101/42* (2018.08); *H05K 2203/044* (2013.01); *H05K 2203/143* (2013.01); *H05K 2203/16* (2013.01); *H05K 2203/173* (2013.01)

(58) Field of Classification Search
CPC ..................................................... H05K 3/225
See application file for complete search history.

(56) References Cited

U.S. PATENT DOCUMENTS

| | | |
|---|---|---|
| 4,857,018 A | 8/1989 | Pickles |
| 5,073,118 A | 12/1991 | Grabbe et al. |
| 5,548,486 A | 8/1996 | Kman et al. |

(Continued)

FOREIGN PATENT DOCUMENTS

| | | | |
|---|---|---|---|
| DE | 102016218788 A1 | 3/2018 | |
| JP | 06085419 A * | 3/1994 | ............. H05K 3/225 |

(Continued)

OTHER PUBLICATIONS

Gruber et al., "Module Connection", TDB v37 n1 1-94. IPCOM000110967D, Mar. 26, 2005. p. 595-596.

(Continued)

*Primary Examiner* — Devang R Patel
(74) *Attorney, Agent, or Firm* — Cantor Colburn LLP; Tihon Poltavets (57) ABSTRACT

Aspects of the invention include a press-fit pin for mechanically and electrically connecting to a through-hole of a substrate. The press-fit pin can include a press-fit portion configured to be deformed upon insertion into the through-hole against a plated surface of the through-hole. A surface mount technology (SMT) pad can be coupled to a first end of the press-fit portion. The SMT pad can include a conductive material. The press-fit pin can further include a trace extension coupled to the SMT pad. The trace extension can extend from the SMT pad in a direction perpendicular to the press-fit portion. The press-fit pin can include a tip portion coupled to a second end of the press-fit portion.

7 Claims, 5 Drawing Sheets

(51) Int. Cl.
 *B23K 3/06* (2006.01)
 *B23K 101/42* (2006.01)

(56) References Cited

U.S. PATENT DOCUMENTS

| | | | |
|---|---|---|---|
| 6,997,727 | B1 | 2/2006 | Legrady et al. |
| 7,399,930 | B1* | 7/2008 | Palmeri ................ H05K 3/3447 |
| | | | 174/250 |
| 8,064,214 | B2 | 11/2011 | Frasco |
| 9,137,898 | B2 | 9/2015 | Frasco |
| 10,230,184 | B1 | 3/2019 | Myer et al. |
| 2008/0166928 | A1 | 7/2008 | Tang |
| 2012/0228013 | A1* | 9/2012 | Matienzo ................ H05K 3/225 |
| | | | 977/773 |
| 2021/0273355 | A1* | 9/2021 | Dangler ............... H01R 12/585 |

FOREIGN PATENT DOCUMENTS

| | | | | |
|---|---|---|---|---|
| JP | 11135699 | A | * 5/1999 | ............... H05K 3/34 |
| JP | 2012074326 | A | 4/2021 | |

OTHER PUBLICATIONS

Repairability Subcommittee, "Rework, Modification and Repair of Electronic Assemblies," IPC-7711C/7721C, Mar. 2014. 17 Pages.
ShenZhen ZhiZhan Electronics Co., LTD "CT-1025E Servo Press-fit Machine for Precise Connector" Jun. 9, 2021. 20 Pages.

\* cited by examiner

FIG. 5

COMPLIANT PIN SURFACE MOUNT TECHNOLOGY PAD FOR REWORK

BACKGROUND

The present invention generally relates to computer systems, and more specifically, to a compliant pin surface mount technology (SMT) pad for printed circuit board (PCB) rework situations.

Printed circuit boards (PCB's) having a variety of electrical components are widely used in the electronics industry in products including computers, servers, televisions, and telecommunication devices. In the early days of these electronic products, components, such as microprocessor central processing units (CPU's), secondary PCB's (sometimes referred to as daughter cards), and other electrical components were soldered directly to a primary PCB (referred to as the mother board). Although this was a cost-efficient mounting method, modern scaling pressures have greatly increased the electrical coupling complexity between components. For example, the number of connections has increased while their sizes have decreased. This has greatly increased the cost and complexity of PCB rework, which involves removing, replacing, and repairing solder connections between these components. Without effective rework processes solder damage results in an unusable card, reducing yield and slowing manufacturing.

In response, insertion-based electrical connectors such as the compliant press-fit pin have been developed. These press-fit pins are used to shorten the PCB assembly time and simply the insertion and removal of connected items. Press-fit pins typically include a spring-loaded contact or press-fit zone that has a larger diameter than the metal plated through hole (PTH) into which it is pressed. The press-fit zone is deformed (mainly by compression) when the pin is inserted into the PTH. The compression against the spring-loaded contact and friction against the sidewalls of the PTH wedges the press-fit pin within the PTH, ensuring a secure electrical contact without solder.

SUMMARY

Embodiments of the present invention are directed to a press-fit pin for mechanically and electrically connecting to a through-hole of a substrate. A non-limiting example press-fit pin includes a press-fit portion configured to be deformed upon insertion into the through-hole against a plated surface of the through-hole. A surface mount technology (SMT) pad can be coupled to a first end of the press-fit portion. The SMT pad can include a conductive material. The press-fit pin can further include a trace extension coupled to the SMT pad. The trace extension can extend from the SMT pad in a direction perpendicular to the press-fit portion. The press-fit pin can include a tip portion coupled to a second end of the press-fit portion.

Embodiments of the present invention are directed to methods for repairing damaged dogbone-style vias. A non-limiting example method includes receiving a printed circuit board comprising a dogbone-style via. The dogbone-style via can include an SMT land trace and an annular ring on top of a through-hole. A portion of the SMT land trace is damaged, thereby breaking electrical continuity between the SMT land trace and the annular ring. A press-fit pin can be inserted into the through-hole. A length of a trace extension of the press-fit pin can be modified such that after insertion of the press-fit pin into the through-hole the trace extension bypasses the damaged portion of the SMT land trace. The trace extension can be soldered to the SMT land trace, thereby restoring electrical continuity between the SMT land trace and the annular ring.

Embodiments of the present invention are directed to methods for preventing flux migration during wave soldering. A non-limiting example method includes preparing a printed circuit board for wave soldering. The printed circuit board can include a plurality of through-holes. The method includes identifying a through-hole of the plurality of through-holes that is susceptible to passing excess flux when wave soldering. A press-fit pin is inserted into the identified through-hole. A diameter of the press-fit pin is selected to be greater than a diameter of the through-hole. An SMT pad of the press-fit pin is configured to make direct contact with a surface of the through-hole after insertion, thereby plugging the through-hole. The method includes passing the printed circuit board over a nozzle of a spray fluxer, thereby applying flux spray to a surface of the printed circuit board. The method further includes passing the printed circuit board over a wave soldering system. The wave soldering system can include a solder bath and one or more wave portions. The SMT pad prevents the flux spray from migrating through the through-hole.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Almost all microprocessor central processing units (CPU's), printed circuit boards and assemblies (printed circuit boards (PCBs) and PCB assemblies (PCBAs)) used by electronic products include a large number of vias and plated through holes (PHTs) for external and internal electrical coupling. The positioning of these vias and PHTs can sometimes cause problems during various PCB processes, such as when making second level attachments (e.g., attaching a ball grid array (BGA) to a PCB) and while attempting PCB rework (e.g., solder reflows).

In many surface mount technology (SMT) designs, for example, one or more solder joints are positioned between an SMT device and a via annular ring. The proximity of the via annular ring to the solder joint results in a high risk of depleting the solder joint during reflow, especially in situations where the annular ring does not have sufficient soldering areas. Depletion can occur if the solder flows down into the via during reflow, leaving the solder joint open between the SMT device (e.g., a BGA) and the PCB. This example is meant to be illustrative only, there are many situations due to handling damage and rework where vias, plated through hole (PTH) annular rings, and SMT lands can be damaged.

One or more embodiments of the present invention address one or more of the above-described shortcomings by providing a compliant pin SMT pad for PCB rework. Embodiments of the present invention can be used for multiple soldering applications associated with via/PTH issues. Specifically, a compliant pin SMT pad constructed according to one or more embodiments can be used during PCB repair and can improve the soldering of PCBs having vias/PTHs regardless of their relative placement on the PCB.

A compliant pin SMT pad constructed according to one or more embodiments includes a press-fit zone and an integrated SMT pad. Any press-fit design can be used for this application and the SMT pad itself can be placed on top of the press-fit zone. In some embodiments of the invention, the SMT pad can be mechanically formed during the manufacturing of the press-fit pin or can be attached to the pin by other techniques (e.g., metal bonding, soldering, welding, brazing). In some embodiments of the invention, the press-fit zone and SMT pad of the press-fit pin is constructed simultaneously through three-dimensional (3D) printing. Advantageously, all typical soldering finishes and base core materials are compatible with the compliant pin SMT pad. In some embodiments of the invention, the finish and/or materials used for the compliant pin SMT pad can be selected to match the finish/materials of the given application or to simplify the repair. For example, decisions regarding Pb-free vs. SnPb, Au versus Sn, metal finish versus organic solderability preservative (OSP), etc., can be made depending on the conditions of a particular application.

The compliant pin SMT pad can be used to plug pathways through vias and PTHs to prevent solder and flux flow from inadvertently being pulled down/through to the wrong locations. In this manner, a compliant pin SMT pad constructed according to one or more embodiments can be a very helpful tool in preventing scrap and improving yields by mitigating complications during PCB repair/rework applications. The compliant pin SMT pad can be employed to fixed lands, annular rings, and/or traces near those annular rings. In some embodiments of the invention, the compliant pin SMT pad can include traces and/or lands that can be attached to or integrated with the SMT pad itself. These traces/lands can be used to simplify an otherwise complex repair process. For example, damage to dogbone-style vias (where an SMT land trace is connected to the annular ring of a top via/PTH) can be repaired by inserting the compliant pin SMT pad into the via/PTH, aligning the pin-integrated trace/land over the damaged land trace of the dogbone-style via, and soldering the integrated traces/lands of the pin to the SMT land trace, thereby bypassing the damaged portions of the dogbone-style via without requiring the relatively more difficult re-soldering of the annular ring surface. Other advantages are possible, and those specifically mentioned are provided for convenience to illustrate the various possible uses for a compliant pin SMT pad constructed according to one or more embodiments. Yet another advantage, for example, is that the compliant pin SMT pad can be used to improve electrical conductivity for touch probe locations that are engaging vias/PTHs by increasing the conductive surface area.

Figure 1:
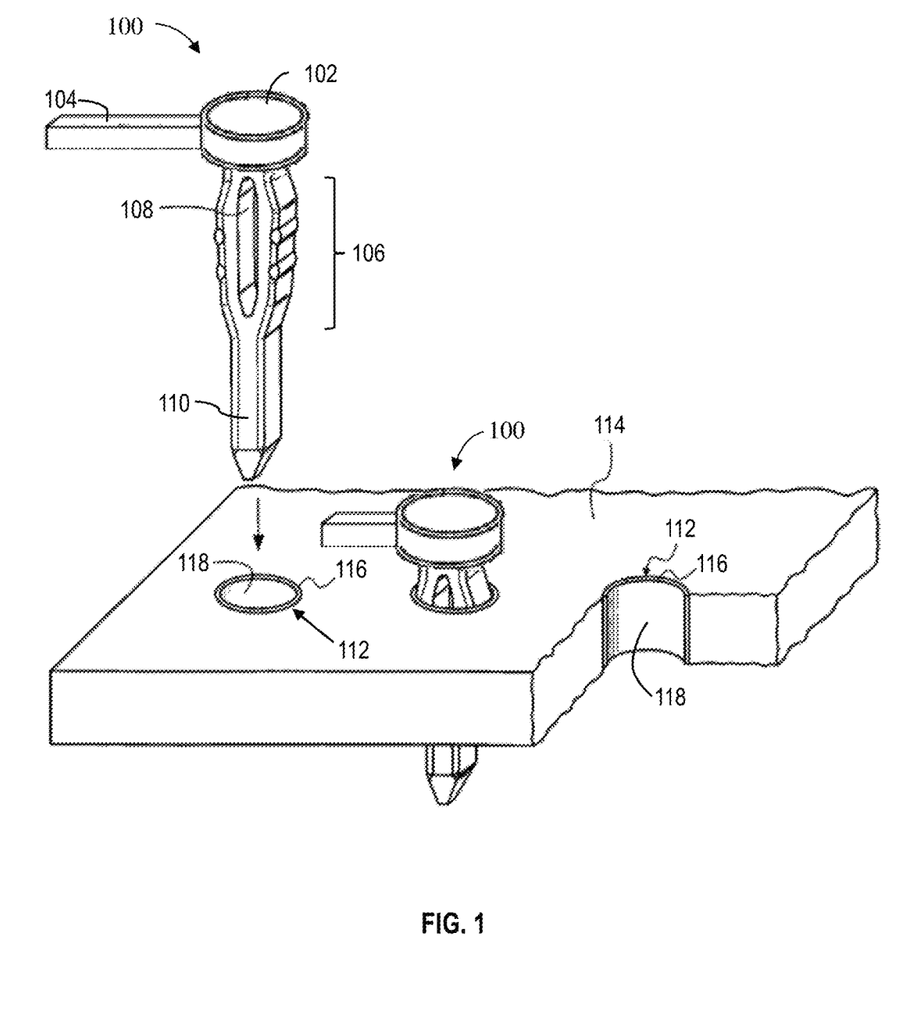
FIG. 1 depicts a perspective view of a compliant pin surface mount technology (SMT) pad constructed in accordance with one or more embodiments of the present invention.

FIG. 1 illustrates a perspective view of a compliant pin SMT pad 100 constructed in accordance with one or more embodiments of the present invention. As shown in FIG. 1, the compliant pin SMT pad 100 can include a SMT pad 102, a trace extension 104, a press-fit zone 106 (press-fit portion), two or more arm portions 108, and a tip portion 110.

In some embodiments of the invention, the SMT pad 102 is a conductive pad. The conductive material can include, for example, a metal (e.g., gold, lead, tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the SMT pad 102 is made of a same conductive material as the particular application, for example, a same material as the plating of a PTH 112 of a PCB 114. In some embodiments of the invention, the SMT pad 102 is made of or coated with a same conductive material as a solder selected for application onto the SMT pad 102. In some embodiments of the invention, a diameter of the SMT pad is sufficient to overlap an annular ring of a through-hole (e.g., a via/PTH).

In some embodiments of the invention, the trace extension 104 extends from sidewalls of the SMT pad 102 (as shown). In some embodiments of the invention, the trace extension 104 extends from the topmost surface of the SMT pad 102 (not separately illustrated). The trace extension 104 can extend from the sidewall or top surface of the SMT pad 102 in a direction that is perpendicular to the press-fit portion 106. The trace extension 104 can be made of a same or different material as the SMT pad 102 (e.g., a conductor). In some embodiments of the invention, the trace extension 104 is attached to the SMT pad 102 using, for example, metal bonding techniques such as soldering, welding, and brazing. In some embodiments of the invention, the trace extension 104 and the SMT pad 102 are formed as a single component during the manufacturing process using, for example, molding or 3D printing. While shown with a single trace extension 104 for ease of illustration, it is understood that the compliant pin SMT pad 100 can include any number of trace extensions at any relative orientation. In some embodiments of the invention, the number and arrangement of the trace extensions for a given compliant pin SMT pad 100 are designed for a specific application having known trace requirements (due to, e.g., the specific conductor geometries on the PCB surface). Moreover, it should be further understood that the trace extensions of various possible compliant pin SMT pads need not have the same length. Instead, the length of each trace extension can be modified to fit a specific application. This is true even for compliant pin SMT pads having two or more trace extensions.

In some embodiments of the invention, the SMT pad 102 is directly coupled to a top portion of the press-fit zone 106, for example, at an end of two or more arm portions 108. The SMT pad 102 can be coupled to the press-fit zone 106 using a variety of techniques, such as, for example, soldering, welding, and brazing. In some embodiments of the invention, the SMT pad 102 and the press-fit zone 106 are formed as a single component during the manufacturing process using, for example, molding or 3D printing. While shown with two arm portions for ease of illustration, it is understood that the press-fit zone 106 can include any number of arm portions (e.g., 2, 3, 4, etc.). In some embodiments of the invention, the arm portions 108 extend along a longitudinal axis of the press-fit portion (i.e., perpendicular to the topmost surface of the SMT pad 102). In some embodiments of the invention, the arm portions 108 are configured to be compressively and elastically deformed upon insertion into a through-hole.

In some embodiments of the invention, the compliant pin SMT pad 100 includes a tip portion 110 that extends from a bottom portion of the press-fit zone 106 (e.g., an opposite surface from the SMT pad 102). In some embodiments of the invention, the tip portion 110 includes a tapered end (as shown), although other configurations are within the contemplated scope of the invention.

As further shown in FIG. 1, the compliant pin SMT pad 100 can be inserted into the PTH 112 of the PCB 114. The PTH 112 can include a plated surface 116 and an opening 118. In some embodiments of the invention, the plated surface 116 includes a conductive material. Suitable conductive materials include, for example, a metal (e.g., gold, lead, tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials.

In some embodiments of the invention, the press-fit zone 106 has a larger diameter than the opening 118 of the PTH 112. Moreover, the press-fit zone 106 can be designed to flex or otherwise deform (elastically and/or compressively) by pressing against the sides of the two or more arm portions 108. For example, the arm portions 108 can be designed to compress/depress at a predetermined spring constant. Consequently, during insertion, the press-fit zone 106 (e.g., the two or more arm portions 108) is compressed against the plated surface 116. The spring constant of the press-fit zone 106 acts against this compressive force, ensuring a reliable connection to the PTH 112.

Figure 2A:
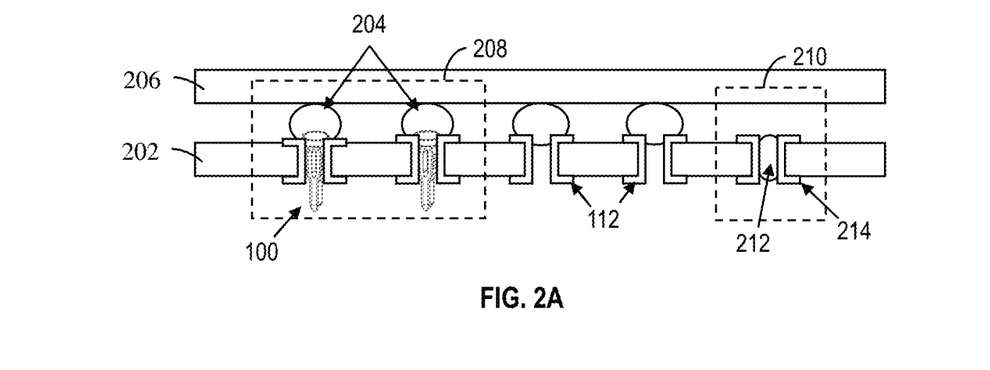
FIG. 2A depicts an exemplary use case for a compliant pin SMT pad constructed in accordance with one or more embodiments of the present invention.

FIG. 2A illustrates an exemplary use case for a compliant pin SMT pad constructed in accordance with one or more embodiments of the present invention. As discussed previously, one complication for PCB rework involves solder joint loss through a via adjacent to the initial placement of the solder. These relative arrangements between solder and vias/PTHs are not always avoidable (i.e., it is not always possible to move the solder ball or to design a PCB such that the vias/PTHs are not adjacent to future solder ball locations). For example, a BGA or any other type of SMT component may be designed to connect to a PCB using solder applied over a via, PTH, and/or annular ring. In this scenario it is not uncommon for the via to starve the solder joint by having the solder go down the via/PTH, resulting in yield loss or expensive manual repairs.

As shown in FIG. 2A, one or more compliant pin SMT pads (e.g., the compliant pin SMT pad 100) can be inserted into one or more vias or PTHs (e.g., the PTH 112) of a PCB 202. Inserting the compliant pin SMT pad into a via or PTH serves several purposes. For one, the compliant pin SMT pad physically blocks the opening in the via or PTH, preventing the solder from flowing down into the via or PTH during reflow/rework. Moreover, the compliant pin SMT pad provides an increased solderable area for any SMT connections. The increased area provides a more reliable solder joint that will make stronger solder fillets 204.

Figure 2B:
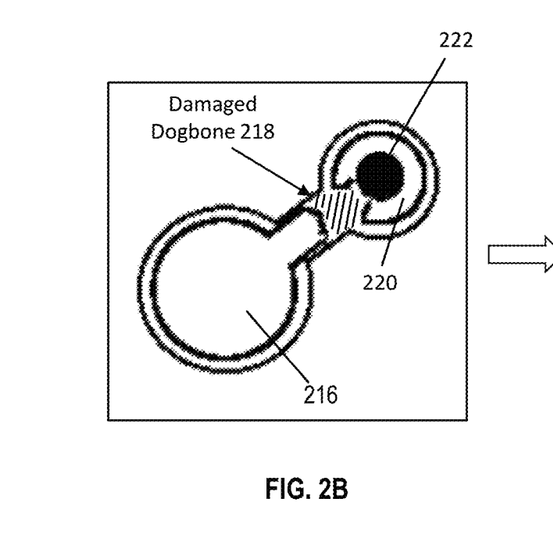
FIG. 2B depicts a damaged dogbone-style SMT land trace.

As further shown in FIG. 2A, an SMT component 206 can be affixed to the PCB 202 using solder applied between the SMT component 206 and the vias, PTHs, and annular rings of the PCB 202 (see, e.g., FIG. 2B for a top-down view of a via/PTH having an annular ring). The SMT component 206 can include, for example, a BGA socket or component, or any other type of SMT component designed to solder over a via, PTH, and/or annular ring of a PCB.

In some cases, solder joint loss through a via/PTH is more prevalent or severe at one or more specific locations along the PCB 202. For example, solder loss can be more common at edge portions of the PCB 202, or at portions of the PCB 202 subject to higher temperatures or mechanical stresses. Detail 208 depicts an edge region (or other problematic region) of the PCB 202 having compliant pin SMT pads installed in the respective vias/PTHs according to one or more embodiments. In some embodiments of the invention, compliant pin SMT pads are placed within the vias/PTHs that are within these known problematic areas while other vias/PTHs are not similarly plugged. Alternatively, all or any portion of the vias/PTHs can be plugged using compliant pin SMT pads. Detail 210 depicts an edge region (or other problematic region) of the PCB 202 when the associated vias and/or PTHs are not provided a compliant pin SMT pad according to one or more embodiments. As shown in detail 208, the solder 212 has been pulled down into the PTH 214, breaking the connection to the SMT component 206.

Figure 2C:
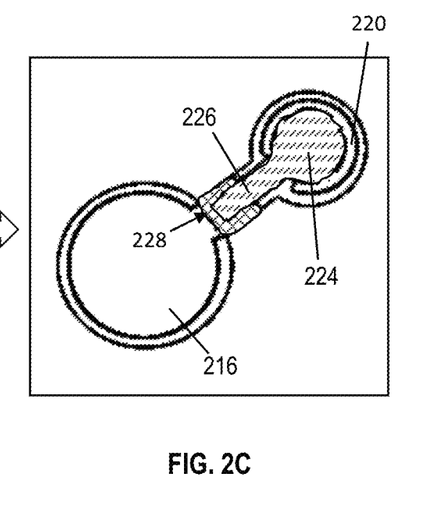
FIG. 2C depicts the damaged dogbone-style SMT land trace of FIG. 2B after inserting a compliant pin SMT pad in accordance with one or more embodiments of the present invention.

FIGS. 2B and 2C illustrate another exemplary use case for a compliant pin SMT pad constructed in accordance with one or more embodiments of the present invention. Some PCB design rely on so-called dogbone-style via designs for coupling various area array components to the PCB. In a dogbone-style via an SMT land trace is connected to the annular ring on top of a via/PTH. During handling and/or site dress these dogbone-style vias and their connections can be damaged. For example, the SMT land trace and/or the annular ring can be fully or partially torn off from the PCB surface, which will usually result in the card being scrapped. Advantageously, a compliant pin SMT pad constructed in accordance with one or more embodiments of the present invention can be used to fix these damaged connections between a land trace and an annular ring by bypassing the missing or damaged portions.

FIG. 2B depicts a dogbone-style SMT land trace 216 having a damaged dogbone portion 218 (e.g., a damaged trace). The nature of the damage can vary from application to application, but can include, for example, a missing or disrupted surface line track. The damaged dogbone portion 218 breaks electrical continuity between the SMT land trace 216 and the annular ring 220 of the via (or PTH) 222.

FIG. 2C depicts the same dogbone-style SMT land trace 216 depicted in FIG. 2B after a compliant pin SMT pad 224 is placed in the via 222. As shown in FIG. 2C, the compliant pin SMT pad 224 can include a trace extension 226. The trace extension 226 can be formed in a similar manner as the trace extension 104 (depicted in FIG. 1). In some embodiments of the invention, the trace extension 226 is cut (after it is manufactured) or designed (prior to manufacturing) to a length specifically suitable for repairing the SMT land trace 216. For example, the length of the trace extension 226 can be cut or fabricated to a length sufficient to bypass the damaged dogbone portion 218.

As further shown in FIG. 2C, the compliant pin SMT pad 224 and trace extension 226 can fill the via 222 and wholly or partially cover the annular ring 220. Moreover, the trace extension 226 can cover the damaged dogbone portion 218. The trace extension 226 serves as a new trace that can be coupled to the SMT land trace 216 using a solder joint 228, thereby bypassing the damaged portions of the surface line. One advantage of repairing damaged dogbones in this manner is the complete avoidance of any complicated soldering of the annular ring region itself. Another advantage is the fact that the solder repair is always done in the same relative location—at the damaged interface between an SMT land trace and the annular ring of the respective via—rather than at any arbitrary point between the SMT land trace and the annular ring. This simplifies the training process and lowers the dexterity required to make these types of repairs.

There are several options for coupling the trace extension 226 to the SMT land trace 216, such as, for example, hand soldering with solder wire and solder tip, or applying solder paste to the defective traces before installation of the new compliant pin SMT pad 224 and then following up with a localized hot air rework technique. Other examples include providing a plated solder layer or coating on the back side (bottommost surface) of the trace extension 226 (not shown) that can be installed and followed by hot bar/cold bar techniques to merge the defective trace with the new trace. Regardless of the method used, in some embodiments of the invention, the locations adjacent to the rework area can be cleaned of any excessive contamination (e.g., excess solder).

Figure 3:
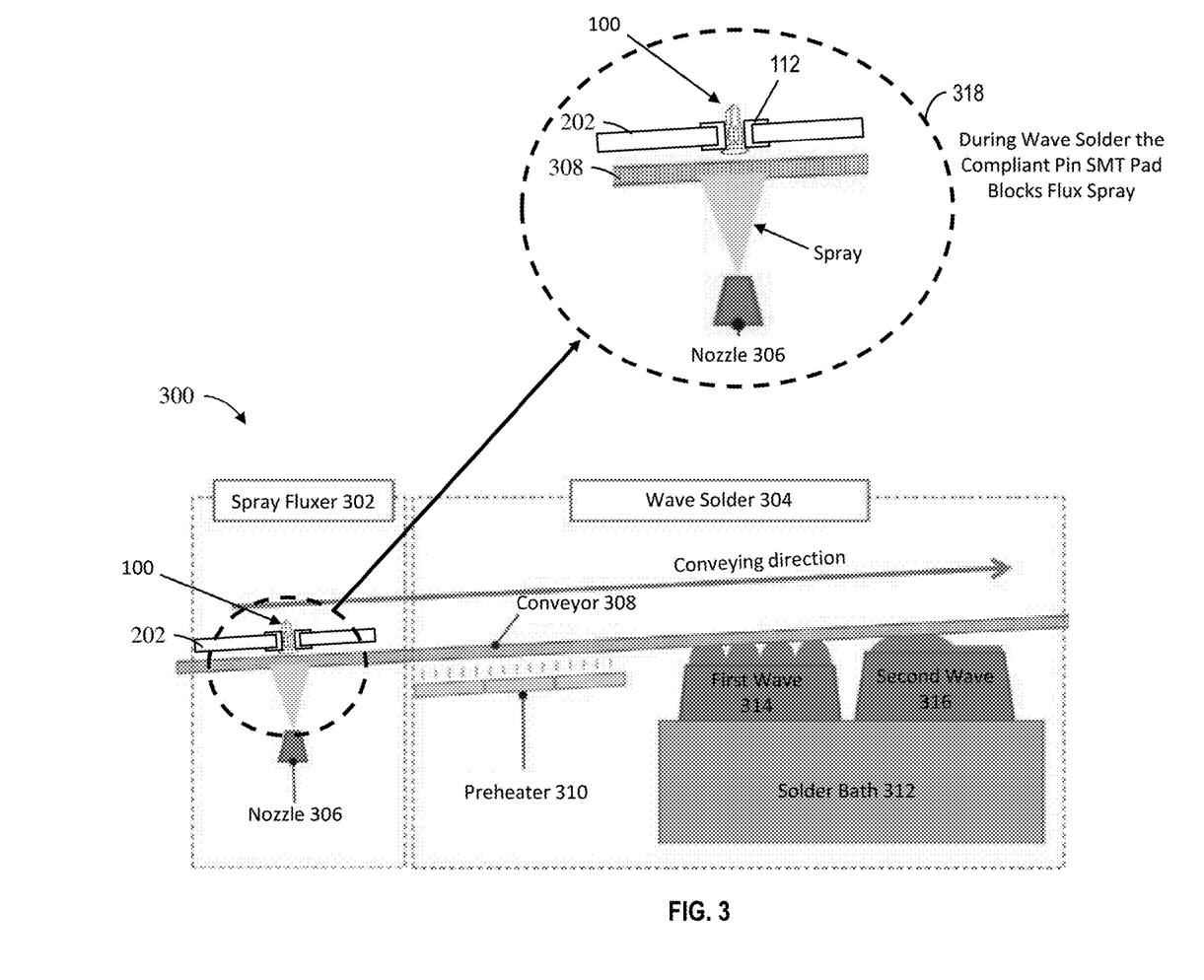
FIG. 3 depicts another exemplary use case for a compliant pin SMT pad constructed in accordance with one or more embodiments of the present invention.

FIG. 3 illustrates another exemplary use case for a compliant pin SMT pad constructed in accordance with one or more embodiments of the present invention. Many PCB fabrication and rework schemes include a wave solder (solder fountain) section whereby the PCB is flipped and passed through the wave solder via a conveyor. These types of applications can cause several PCB complications, such as, for example, flux penetrating the vias from the back side, causing flux to reach areas on the topside of the board. Advantageously, these issues can be mitigated or eliminated entirely by installing compliant pin SMT pads constructed as described herein.

A possible modification to the conventional wave soldering scheme is depicted in FIG. 3. As shown, the wave soldering scheme 300 can include a spay fluxer 302 (flux section) and a wave solder 304 (wave section). In some embodiments of the invention, the spray fluxer 302 includes a nozzle 306 configured to dispense (eject, spray, etc.) a flux spray across or through a conveyor 308 to a surface of a PCB (e.g., the PCB 202). The conveyor 308 can be configured to move the PCB 202 from the spray fluxer 302 to the wave solder 304 along a conveying direction. In some embodiments of the invention, the wave solder 304 includes a preheater 310 configured to preheat the PCB 202 (enabling, for example, solder rework or reflow). In some embodiments of the invention, the wave solder 304 includes a solder bath 312. The solder bath 312 can include one or more wave sections, such as, for example, a first wave 314 and a second wave 316.

In some embodiments of the invention, various vias/PTHs/annular rings of the PCB 202 are plugged with a compliant pin SMT pad (e.g., the compliant pin SMT pad 100). Detail 318 illustrates a detailed view of the PCB 202 having one or more compliant pin SMT pad installed according to one or more embodiments. While only a single compliant pin SMT pad is shown for ease of illustration, it is understood that any number of compliant pin SMT pads can be similarly installed in the various vias/PTHs of the PCB 202.

In some embodiments of the invention, compliant pin SMT pads are installed in all vias/PTHs/annular rings of the PCB 202. In some embodiments of the invention, compliant pin SMT pads are only installed in a subset of the vias/PTHs/annular rings known to be susceptible to excess flux creep or board penetration (using, e.g., process knowledge from prior runs). Installing the compliant pin SMT pads in this manner will prevent or mitigate the flow of flux through the vias/PTHs, preventing or mitigating excess flux creep to top regions of the PCB surface, which reduces various reliability risks and keeps the printed circuit board assembly cleaner.

FIGS. 2A, 2B, 2C, and 3 depicted various advantages from using compliant pin SMT pads constructed in accordance with one or more embodiments. Other advantages are possible and those shown are not meant to be exhaustive. For example, compliant pin SMT pads can assist in probing operations by providing additional probing locations or by increasing preexisting probing contact areas. One challenge in PCB probing schemes is that, often, annular rings are covered with so-called "no clean flux." While helpful in keeping the board clean, the presence of no clean flux can make in-circuit/function testing (ICT/FCT) and flying probe testing more difficult, as the flux prevents direct probe contact. A procedure for using compliant pin SMT pads to mitigate this issue includes selecting one or more compliant pin SMT pads having appropriate dimensions (e.g., diameter, trace extension length, etc.) for the probing application and installing the compliant pin SMT pads where needed. Ideal locations can include, for example, probing locations for lab probing/signal integrity and vias/PTHs that need additional testing contact areas. The compliant pin SMT pads can provide more electrically conductive areas for the probe to hit, making ICT/Flying Probe measurements easier and more accurate (less faulty or incomplete connections).

Figure 4:
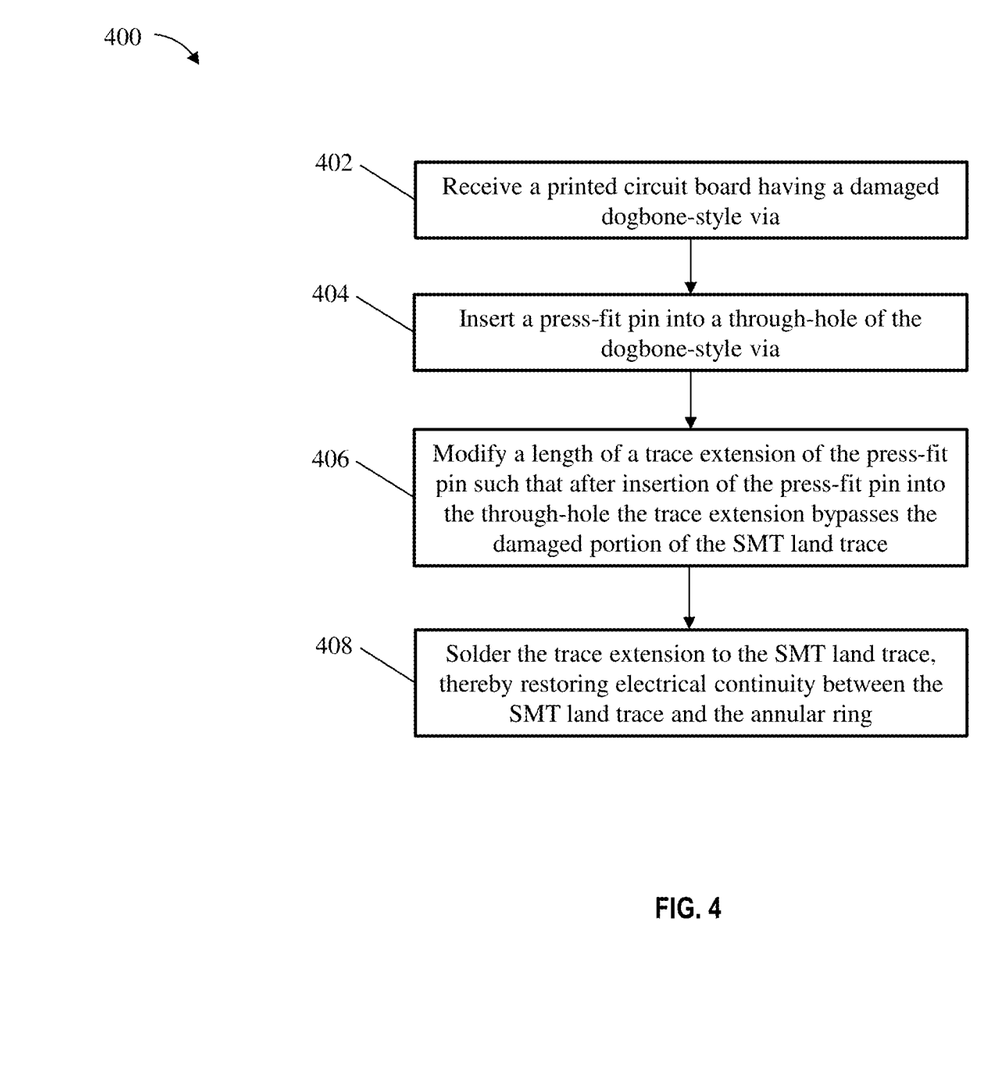
FIG. 4 is a flowchart in accordance with one or more embodiments of the present invention.

Referring now to FIG. 4, a flowchart 400 for repairing damaged dogbone-style vias is generally shown according to an embodiment. The flowchart 400 is described in reference to FIGS. 1-3 and may include additional steps not depicted in FIG. 4. Although depicted in a particular order, the blocks depicted in FIG. 4 can be rearranged, subdivided, and/or combined. At block 402, a printed circuit board is received. The printed circuit board can include one or more dogbone-style vias. In some embodiments of the invention, each dogbone-style via includes an SMT land trace and an annular ring on top of a through-hole (e.g., a via, PTH, etc.). In some embodiments of the invention, a portion of the SMT land trace is damaged, thereby breaking electrical continuity between the SMT land trace and the annular ring.

At block 404, a press-fit pin is inserted into the through-hole. In some embodiments of the invention, the press-fit pin includes a press-fit portion configured to be deformed upon insertion into the through-hole against a plated surface of the through-hole. In some embodiments of the invention, the press-fit pin includes an SMT pad coupled to a first end of the press-fit portion. In some embodiments of the invention, the SMT pad is wholly or partially made of a conductive material. In some embodiments of the invention, the SMT pad is configured to make direct contact with the annular ring after insertion. In some embodiments of the invention, the press-fit pin includes a trace extension coupled to the SMT pad. The trace extension can extend from the SMT pad in a direction perpendicular to the press-fit portion. In some embodiments of the invention, a diameter of the SMT pad is chosen to fully or partially overlap the annular ring.

At block 406, a length of the trace extension is modified such that after insertion of the press-fit pin into the through-hole, the trace extension bypasses the damaged portion of the SMT land trace. In some embodiments of the invention, the length of the trace extension is modified prior to insertion of the press-fit pin into the through-hole. In some embodiments of the invention, the length of the trace extension is modified after insertion of the press-fit pin into the through-hole.

At block 407, the trace extension is soldered to the SMT land trace, thereby restoring electrical continuity between the SMT land trace and the annular ring. In some embodiments of the invention, a bottommost surface of the trace extension includes a plated solder layer (or, alternatively, a conductive coating). In some embodiments of the invention, soldering the trace extension to the SMT land trace includes soldering the plated solder layer to the SMT land trace. In some embodiments of the invention, soldering the trace extension to the SMT land trace includes hand soldering a portion of the trace extension to the SMT land trace using solder wire and a solder tip.

Figure 5:
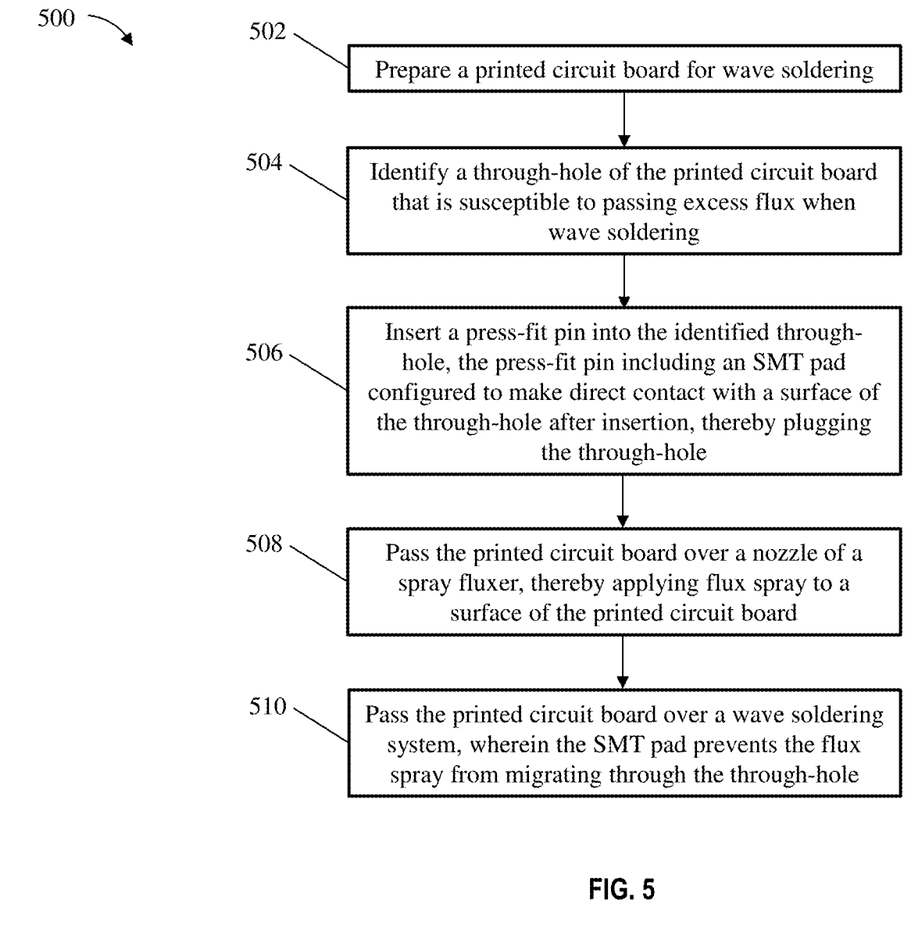
FIG. 5 is a flowchart in accordance with one or more embodiments of the present invention.

Referring now to FIG. 5, a flowchart 500 for preventing flux migration during wave soldering is generally shown according to an embodiment. The flowchart 500 is described in reference to FIGS. 1-3 and may include additional steps not depicted in FIG. 5. Although depicted in a particular order, the blocks depicted in FIG. 5 can be rearranged, subdivided, and/or combined. At block 502, a printed circuit board is prepared for wave soldering. Preparation can include any known pretreating processes (e.g., partial tape off, covering, heating, placing on a conveying system, etc.). In some embodiments of the invention, the printed circuit board includes a plurality of through-holes.

At block 504, a through-hole of the plurality of through-holes is identified that is susceptible to passing excess flux when wave soldering.

At block 506, a press-fit pin is inserted into the identified through-hole. The press-fit pin can include a press-fit portion configured to be deformed upon insertion into the through-hole against a plated surface of the through-hole. In some embodiments of the invention, a diameter of the press-fit portion is selected to be greater than a diameter of the through-hole. The press-fin pin can include an SMT pad coupled to a first end of the press-fit portion. The SMT pad can include a conductive material.

In some embodiments of the invention, the SMT pad is configured to make direct contact with a surface of the through-hole after insertion, thereby plugging the through-hole. The press-fit pin can include a trace extension coupled to the SMT pad. The trace extension can extend from the SMT pad in a direction perpendicular to the press-fit portion. In some embodiments of the invention, a diameter of the SMT pad is chosen to overlap an annular ring of the through-hole.

At block 508, the printed circuit board is passed over a nozzle of a spray fluxer, thereby applying flux spray to a surface of the printed circuit board.

At block 510, the printed circuit board is passed over a wave soldering system that includes a solder bath and one or more wave portions. In some embodiments of the invention, the SMT pad prevents the flux spray from migrating through the through-hole. In some embodiments of the invention, the printed circuit board is passed from the spray fluxer to the wave soldering system via a conveyor.

In some embodiments of the invention, the wave soldering system can further include a preheater positioned below the conveyor at a point between the spray fluxer and the solder bath. In some embodiments of the invention, the press-fit pin is configured to be removable after wave soldering. In some embodiments of the invention, identifying the through-hole includes identifying regions of the printed circuit board which have been susceptible to passing excess flux during prior wave soldering processes (i.e., leveraging process knowledge).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, conventional techniques related to semiconductor device, integrated circuit (IC), printed circuit board (PCB), and/or surface mount technology (SMT) device and component fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   receiving a printed circuit board comprising a dogbone-style via, the dogbone-style via comprising a surface mount technology (SMT) land trace and an annular ring on top of a through-hole, wherein a portion of the SMT land trace is damaged, thereby breaking electrical continuity between the SMT land trace and the annular ring;
   inserting a press-fit pin into the through-hole, the press-fit pin comprising:
      a press-fit portion configured to be deformed upon insertion into the through-hole against a plated surface of the through-hole;
      an SMT pad coupled to a first end of the press-fit portion, the SMT pad comprising a conductive material, the SMT pad configured to make direct contact with the annular ring after insertion; and
      a trace extension coupled to the SMT pad, the trace extension extending from the SMT pad in a direction perpendicular to the press-fit portion;
   modifying a length of the trace extension such that after insertion of the press-fit pin into the through-hole the trace extension bypasses the damaged portion of the SMT land trace; and
   soldering the trace extension to the SMT land trace, thereby restoring electrical continuity between the SMT land trace and the annular ring.

2. The method of claim 1, wherein a bottommost surface of the trace extension comprises a plated solder layer.

3. The method of claim 2, wherein soldering the trace extension to the SMT land trace comprises soldering the plated solder layer to the SMT land trace.

4. The method of claim 1, wherein soldering the trace extension to the SMT land trace comprises hand soldering a portion of the trace extension to the SMT land trace using solder wire and a solder tip.

5. The method of claim 1, wherein the length of the trace extension is modified prior to insertion of the press-fit pin into the through-hole.

6. The method of claim 1, wherein the length of the trace extension is modified after insertion of the press-fit pin into the through-hole.

7. The method of claim 1, wherein a diameter of the SMT pad is chosen to fully or partially overlap the annular ring.

* * * * *